US009837781B2

United States Patent
Krishnamoorthy et al.

(10) Patent No.: US 9,837,781 B2
(45) Date of Patent: Dec. 5, 2017

(54) EXTERNAL CAVITY LASER WITH REDUCED OPTICAL MODE-HOPPING

(71) Applicant: Oracle International Corporation, Redwood City, CA (US)

(72) Inventors: Ashok V. Krishnamoorthy, San Diego, CA (US); Jin-Hyoung Lee, San Diego, CA (US); Xuezhe Zheng, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 347 days.

(21) Appl. No.: 14/714,078

(22) Filed: May 15, 2015

(65) Prior Publication Data

US 2017/0324218 A1  Nov. 9, 2017

Related U.S. Application Data

(60) Provisional application No. 62/068,453, filed on Oct. 24, 2014.

(51) Int. Cl.
*H01S 3/10* (2006.01)
*H01S 3/08* (2006.01)
(Continued)

(52) U.S. Cl.
CPC .............. *H01S 3/0637* (2013.01); *H01S 3/10* (2013.01); *H01S 3/10007* (2013.01);
(Continued)

(58) Field of Classification Search
CPC .... H01S 3/0637; H01S 5/065; H01S 3/10007; H01S 3/10; H01S 5/4068; H01S 3/10069; H01S 3/1301; H01S 5/0262; H01S 5/026; H01S 5/021; H01S 5/06837
See application file for complete search history.

(56) References Cited

U.S. PATENT DOCUMENTS 8,988,770 B2  3/2015  Zheng et al.
9,257,814 B1  2/2016  Djordjevic et al.
(Continued)

OTHER PUBLICATIONS

Zheng et al. "Efficient WDM Laser Sources Towards Terabyte/s Silicon Photonic Interconnects", Journal of Lightwave Technology, vol. 31, No. 24, Dec. 15, 2013.

*Primary Examiner* — Yuanda Zhang
(74) *Attorney, Agent, or Firm* — Park, Vaughan, Fleming & Dowler LLP

(57) ABSTRACT

An optical source is described. This optical source includes a semiconductor optical amplifier (with a semiconductor other than silicon) that provides an optical gain medium and that includes a reflector. Moreover the hybrid external cavity laser includes a photonic chip with: an optical waveguide that conveys an optical signal output by the semiconductor optical amplifier; and a ring resonator, having a resonance wavelength, which reflects at least a resonance wavelength in the optical signal, where the reflector and the ring resonator define an optical cavity. Furthermore, the photonic chip includes: a thermal-tuning mechanism that adjusts the resonance wavelength; a photo-detector that measures an optical power output by the ring resonator; and control logic that adjusts the temperature of the ring resonator based on the measured optical power to lock a cavity mode of the optical cavity to a carrier wavelength.

19 Claims, 7 Drawing Sheets

(51) Int. Cl.
*H01S 3/063* (2006.01)
*H01S 5/0683* (2006.01)
*H01S 5/026* (2006.01)
*H01S 3/13* (2006.01)
*H01S 5/02* (2006.01)
*H01S 5/40* (2006.01)
*H01S 5/065* (2006.01)

(52) U.S. Cl.
CPC ........ *H01S 3/10069* (2013.01); *H01S 3/1301* (2013.01); *H01S 5/021* (2013.01); *H01S 5/026* (2013.01); *H01S 5/0262* (2013.01); *H01S 5/065* (2013.01); *H01S 5/06837* (2013.01); *H01S 5/4068* (2013.01)

(56) References Cited

U.S. PATENT DOCUMENTS

| | | | |
|---|---|---|---|
| 9,373,934 B2 | 6/2016 | Lin et al. | |
| 9,653,882 B1* | 5/2017 | Zheng | H01S 5/0687 |
| 2005/0185681 A1* | 8/2005 | Ilchenko | H01S 5/146 372/20 |
| 2008/0259437 A1* | 10/2008 | Suzuki | H01S 5/065 359/326 |
| 2011/0110388 A1* | 5/2011 | Baroni | H01S 5/10 372/26 |
| 2013/0016744 A1* | 1/2013 | Li | B82Y 20/00 372/20 |
| 2014/0268312 A1* | 9/2014 | Zheng | H01S 5/1028 359/344 |
| 2016/0170141 A1 | 6/2016 | Luo et al. | |

* cited by examiner

EXTERNAL CAVITY LASER WITH REDUCED OPTICAL MODE-HOPPING

CROSS-REFERENCE TO RELATED APPLICATION

This application claims priority under 35 U.S.C. §119(e) to U.S. Provisional Application Ser. No. 62/068,453, entitled "Tunable External-Cavity Silicon-Assisted Laser With Minimized Mode-Hopping," by Ashok V. Krishnamoorthy and Xuezhe Zheng, filed on Oct. 24, 2014, the contents of which are herein incorporated by reference.

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure relates to the design of an optical source. More specifically, the present disclosure relates to the design of an external cavity laser with reduced optical mode-hopping.

Related Art

A hybrid external cavity laser often includes a III-V material section as an electrically pumped optical gain medium, and a silicon mirror as the other reflector in the external cavity, as well as an output coupler. This is illustrated in FIG. 1, which presents an example of an existing hybrid external cavity laser. While FIG. 1 illustrates a vertically coupled hybrid external cavity laser that uses a grating coupler to couple the light from a reflective semiconductor optical amplifier (RSOA) into a silicon optical waveguide in a silicon-on-insulator (SOI) technology, other hybrid external cavity lasers are edge-coupled and use tapered edge couplers to couple the light into the silicon optical waveguide. Note that some hybrid external cavity lasers use ultra-efficient tunable silicon photonic reflectors (e.g., silicon micro-rings or ring resonators) to control and tune the wavelength of the laser, and thus to create a tunable laser.

The principle of a hybrid external cavity (silicon-assisted) laser is shown in FIG. 2. The optical cavity mode (which is one of the allowed standing waves in the optical cavity) that experiences the highest reflection from the tunable silicon photonic reflector may dominate the natural optical mode competition in the laser and achieves stable lasing (as shown by the bold vertical line in FIG. 2). A current-adjustment mechanism in the hybrid external cavity laser may be used to control the current injected into the reflective semiconductor optical amplifier. This current can control the amount of output power available from the hybrid external cavity laser. Moreover, a resonance-adjustment mechanism in the hybrid external cavity laser may change the peak of the tunable silicon photonic reflector, which controls the cavity lasing wavelength and the emission wavelength.

However, tunable silicon photonic reflectors are often very sensitive to temperature changes. For example, as the current is increased, heating of the hybrid external cavity laser may occur, which can red-shift the cavity modes (as shown by the other vertical lines in FIG. 2). In particular, because the optical gain and laser section is long (typically, greater than 500 μm in length), the cavity modes are spaced narrowly, with multiple cavity modes present within a resonance of a single ring resonator. Although the injected current can reduce the effective index of refraction (which may partially compensate for this effect) and a tunable silicon photonic reflector may also be used to change the lasing wavelength, the overall effect of temperature is that the specific cavity mode may experience reduced reflectivity as it shifts to longer wavelength. When another cavity mode achieves the highest effective optical gain, then this other cavity mode typically becomes the dominant lasing mode (and may lase preferentially over the previous incumbent lasing optical mode), and the hybrid external cavity laser experiences a hop in the lasing wavelength corresponding to the new cavity mode (and, in particular, a sudden laser optical-mode jump to another cavity mode).

Therefore, while tunability has been achieved in some hybrid external cavity lasers, there are often optical mode-hops present across the tuning range. During data transmission, wavelength optical mode-hops are essentially 'glitches' that can corrupt data transmitted, or may send data to the incorrect destination in a wavelength-division-multiplexed (WDM) system. Consequently, optical mode-hopping is undesirable for digital communication links and typically needs to be reduced before a tunable hybrid external cavity laser may be effectively used for transmitting high-speed data across a range of wavelengths with good fidelity across the communication channel.

Hence, what is needed is a hybrid external cavity laser without the above-described problems.

SUMMARY

One embodiment of the present disclosure provides an optical source that includes a semiconductor optical amplifier defined in a semiconductor other than silicon and having a first edge and a second edge. This semiconductor optical amplifier includes a reflective coating on the first edge, and the semiconductor optical amplifier may provide an optical signal at the second edge. Moreover, the optical source includes a photonic chip optically coupled to the semiconductor optical amplifier. This photonic chip includes: an optical waveguide that conveys the optical signal; and a ring resonator, optically coupled to the optical waveguide and having a resonance wavelength, which reflects at least the resonance wavelength in the optical signal, where the reflective coating and the ring resonator define an optical cavity. Furthermore, the photonic chip includes: a thermal-tuning mechanism, thermally coupled to the ring resonator, which adjusts the resonance wavelength; a photo-detector, optically coupled to an output of the ring resonator, which measures an optical power output by the ring resonator; and control logic, electrically coupled to the thermal-tuning mechanism and the photo-detector, which adjusts the temperature of the ring resonator based on the measured optical power to lock a cavity mode of the optical cavity to a carrier wavelength.

Note that the semiconductor optical amplifier may be edge-coupled to the photonic chip. Alternatively, the semiconductor optical amplifier may be surface-normal coupled to the photonic chip.

In some embodiments, the photonic chip includes: a substrate; a buried-oxide layer disposed on the substrate; and a semiconductor layer disposed on the buried-oxide layer, where the optical waveguide and the ring resonator are defined in the semiconductor layer. For example, the substrate, the buried-oxide layer and the semiconductor layer may constitute a silicon-on-insulator technology.

Moreover, the optical source may include a directional coupler optically coupled to the optical waveguide, where an output optical signal is output from the optical source at an edge of the direction coupler.

Furthermore, the control logic may be configured to adjust the temperature of the ring resonator to minimize the measured optical power.

Additionally, the optical source may include at least a temperature sensor, electrically coupled to the control logic, which determines a parameter associated with a temperature, and the control logic may modify a phase in the optical cavity to adjust the carrier wavelength based on the determined parameter. For example, the phase may be modified in: the semiconductor optical amplifier and/or the photonic chip. Note that the parameter may be associated with at least: a temperature of the semiconductor optical amplifier; and/or a temperature of the photonic chip. In some embodiments, the control logic modifies the phase based on a predefined table of temperatures and associated carrier wavelengths.

Moreover, the optical source may include at least an interferometer, electrically coupled to the control logic, which determines the carrier wavelength. The control logic may modify the phase in the optical cavity to adjust the carrier wavelength based on the determined carrier wavelength.

Furthermore, the optical source may include a temperature-compensation element, optically coupled to the optical waveguide, which compensates for a temperature dependence of indexes of refraction of the optical waveguide. For example, the temperature-compensation element may include a titanium-dioxide optical waveguide.

Another embodiment provides a system that includes: a processor, memory, and the optical source.

Another embodiment provides a method for locking the cavity mode for the external cavity laser. During the method, the optical signal is generated in the semiconductor optical amplifier defined in the semiconductor other than silicon, where the semiconductor optical amplifier includes the reflective coating on the first edge, and the semiconductor optical amplifier provides the optical signal at the second edge. Then, the optical signal is conveyed in the optical waveguide on the photonic chip. Moreover, at least the resonance wavelength in the optical signal is reflected using the ring resonator having the resonance wavelength, where the reflective coating and the ring resonator define the optical cavity. Next, the optical power output by the ring resonator is measured using the photo-detector. Furthermore, the temperature of the ring resonator is modified using the thermal-tuning mechanism, thermally coupled to the ring resonator, to adjust the resonance wavelength based on the measured optical power to lock the cavity mode of the optical cavity.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
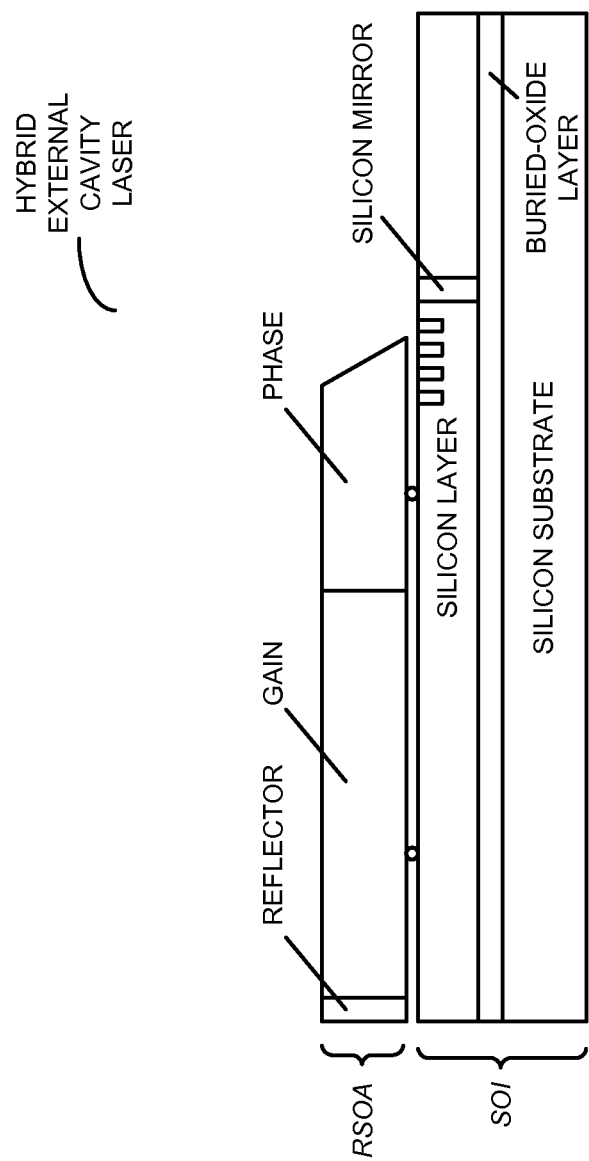
FIG. 1 is a drawing illustrating an existing hybrid external cavity laser.
Figure 2:
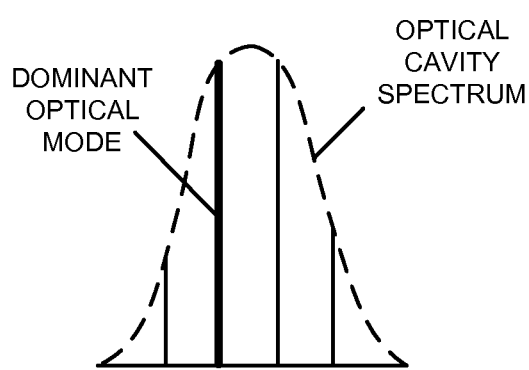
FIG. 2 is a drawing illustrating the operating principle of the existing hybrid external cavity laser of FIG. 1.

Embodiments of a hybrid external cavity laser, a system that includes the hybrid external cavity laser, and a technique for locking a cavity mode for an external cavity laser are described. The hybrid external cavity laser includes a semiconductor optical amplifier (with a semiconductor other than silicon) that provides an optical gain medium and that includes a reflector (such as a mirror). Moreover the hybrid external cavity laser includes a photonic chip with: an optical waveguide that conveys an optical signal output by the semiconductor optical amplifier; and a ring resonator (as a wavelength-selective filter), having a resonance wavelength, which reflects at least a resonance wavelength in the optical signal, where the reflector and the ring resonator define an optical cavity. Furthermore, the photonic chip includes: a thermal-tuning mechanism that adjusts the resonance wavelength; a photo-detector that measures an optical power output by the ring resonator; and control logic that adjusts the temperature of the ring resonator based on the measured optical power to lock a cavity mode of the optical cavity to a carrier wavelength.

By measuring the optical power output by the ring resonator, the hybrid external cavity laser can be dynamically tuned to the carrier wavelength (and, more generally, laser characteristics) without optical mode-hops as the injected current into the hybrid external cavity laser is changed or the temperature changes. In particular, the monitoring and feedback techniques in the hybrid external cavity laser may be used to ensure stable laser operation and to minimize optical mode-hops by controlling and stabilizing the laser mode. For example, the measurements of the output power may be used to continuously detect potential instabilities in the hybrid external cavity laser, and to control a feedback loop that adjusts the resonance wavelength and/or a phase shift to force the laser to operate in an optical mode-hop-free condition. In this way, the hybrid external cavity laser can avoid data glitches or corruption associated with optical mode-hops. Therefore, the hybrid external cavity laser can provide a low-cost, compact, energy-efficient optical source for use in inter-chip and intra-chip connections, such as wavelength-division-multiplexing (WDM) silicon-photonic links. Furthermore, the hybrid external cavity laser may help facilitate high-speed inter- and intra-chip silicon-photonic interconnects, as well as associated systems that can include this component (such as high-performance computing systems).

We now describe embodiments of the optical source, such as a hybrid external cavity laser (which is used as an illustration). As discussed previously, laser stability is typically an important requirement in high-speed communication applications, particularly for energy-efficient, high-speed photonic integrated circuits. Because of the difficulty of monolithic integration of optical gain media (such as III-V compound semiconductors) on to silicon, hybrid external cavity lasers have been investigated. In a hybrid external cavity laser, a semiconductor optical amplifier based on a III-V compound semiconductor provides optical gain (e.g., at or near 1.5 µm) and a silicon photonic chip provides circuits with wavelength selectivity and feedback, and an output coupler to the rest of circuits in silicon photonic chip. However, an important effect impacting laser stability is mode-hopping, which can occur when external parameters are changed (such as the temperature, a pumping condition and/or because of unwanted back-reflection from the rest of the silicon photonic chip). The last is an especially important issue in a hybrid external cavity laser where the optical cavity spans multiple chips and interfaces. Note that optical mode-hopping may result in high-intensity noise, uncontrolled lasing wavelengths and sudden optical-power variation, which can severely degrade the laser performance and may limit its application to high-fidelity optical communication.

These challenges can be addressed by making one or more changes in the structure of the hybrid external cavity laser, thereby achieving a low-noise, single-mode laser. The described changes may concurrently or independently be used to reduce the amount of optical mode-hopping, and a subset with one or more of these changes may be applied to a given hybrid external cavity laser (i.e., not all changes may be simultaneously needed).

Figure 3:
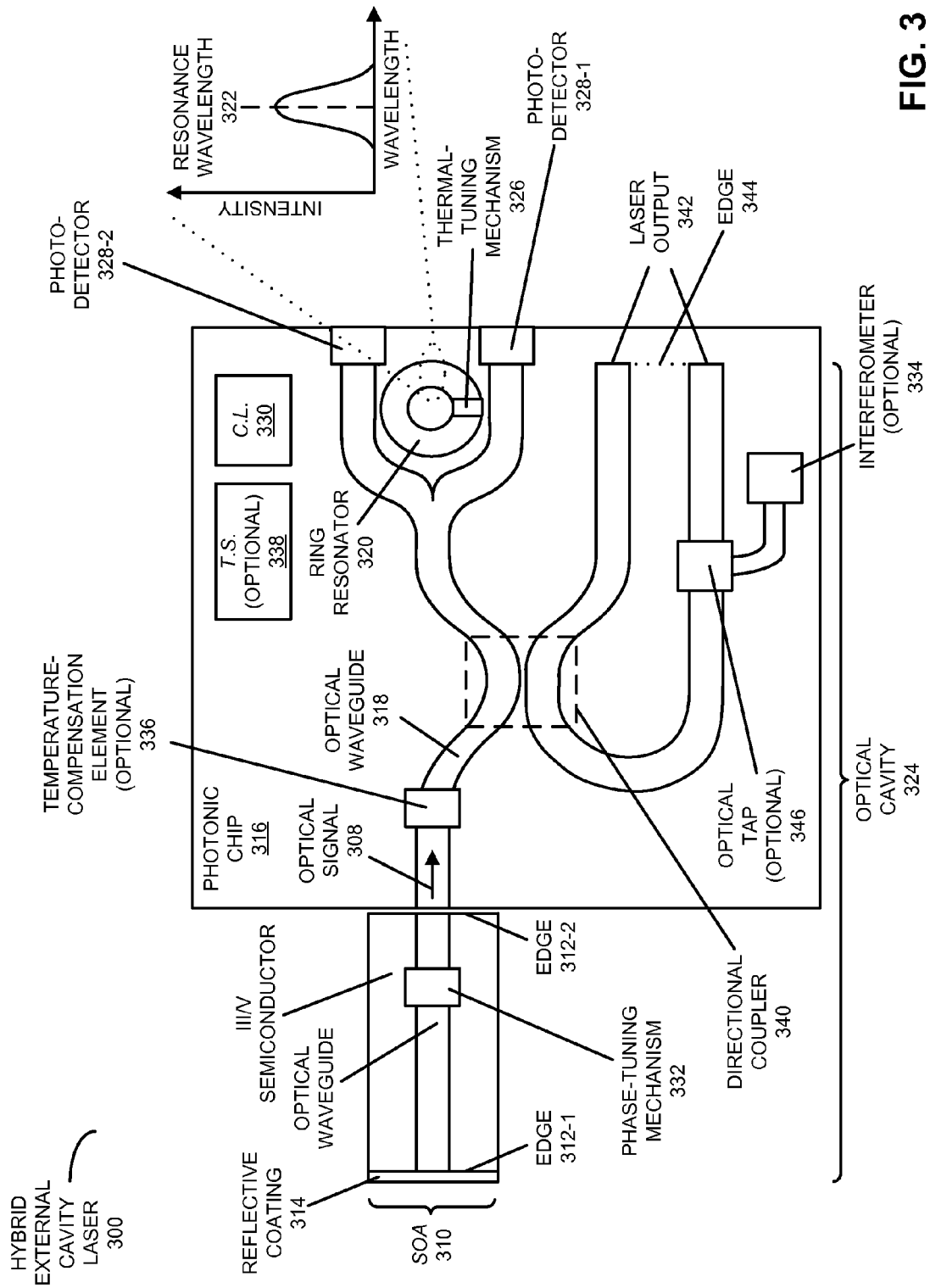
FIG. 3 is a block diagram of a hybrid external cavity laser in accordance with an embodiment of the present disclosure.

FIG. 3 presents a block diagram of a hybrid external cavity laser 300. This hybrid external cavity laser includes: a semiconductor optical amplifier (SOA) 310 defined in a semiconductor other than silicon (such as a III-V compound semiconductor or a semiconductor having a direct bandgap, e.g., gallium-arsenide, indium-phosphide, erbium or germanium) having edges 312. This semiconductor optical amplifier includes a reflective coating (or layer) 314 (such as a mirror) on edge 312-1 (therefore, semiconductor optical amplifier 310 may be a reflective semiconductor optical amplifier), and semiconductor optical amplifier 310 may provide an optical signal 308 at edge 312-2. In particular, optical signal 308 may have an associated carrier or fundamental wavelength λ, such as 1.3 or 1.55 µm.

Moreover, hybrid external cavity laser 300 includes a photonic chip 316 optically coupled to semiconductor optical amplifier 310. This photonic chip includes: an optical waveguide 318 that conveys optical signal 308; a ring resonator 320 (and, more generally, a wavelength-selective filter or reflector), optically coupled to optical waveguide 318 and having a resonance wavelength 322, which reflects at least the resonance wavelength in optical signal 308. Note that reflective coating 314 and ring resonator 320 define an optical cavity 324. Furthermore, photonic chip 316 includes: a thermal-tuning mechanism 326, thermally coupled to ring resonator 320, which adjusts resonance wavelength 322 (e.g., using a heater); at least one photo-detector (such as one of photo-detectors 328), optically coupled to an output of the ring resonator 320, which measures an optical power output by ring resonator 320; and control logic (C.L.) 330, electrically coupled to the thermal-tuning mechanism 326 and at least one of photo-detectors 328, which adjusts the temperature of the ring resonator 320 based on the measured optical power to lock a cavity mode of optical cavity 324 to a carrier wavelength (which may be the same or different than resonance wavelength 322). In particular, control logic 330 may adjust the temperature of ring resonator 320 to minimize the measured optical power.

As shown in FIG. 3, semiconductor optical amplifier 310 may be edge-coupled to photonic chip 316. This edge-to-edge coupling may be facilitated by using a wide optical waveguide in semiconductor optical amplifier 310 (such as an optical waveguide having a width of 2-3 µm), and optical waveguide 318 may have a width of several hundred nanometers. Alternatively, semiconductor optical amplifier 310 may be surface-normal coupled to photonic chip 316. For example, semiconductor optical amplifier 310 may be flip-chip bonded onto photonic chip 316, and the surface-normal coupling may involve etched or angled mirrors or grating couplers (such as a diffraction grating).

Figure 4:
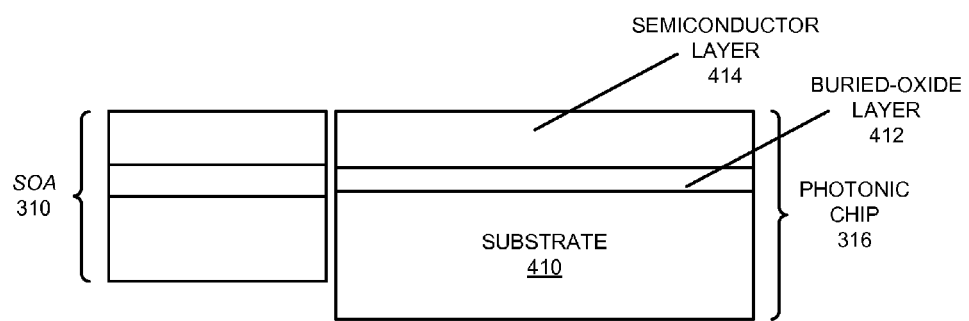
FIG. 4 is a block diagram illustrating a side view of a photonic chip in the hybrid external cavity laser of FIG. 3 in accordance with an embodiment of the present disclosure.

Moreover, as shown in FIG. 4, which presents a side view of photonic chip 316, photonic chip 316 may include: a substrate 410; a buried-oxide layer 412 disposed on substrate 410; and a semiconductor layer 414 disposed on buried-oxide layer 412, where optical waveguide 318 (FIG. 3) and ring resonator 320 (FIG. 3) are defined in semiconductor layer 414. For example, substrate 410, buried-oxide layer 412 and semiconductor layer 414 may constitute a silicon-on-insulator technology. Thus, substrate 410 and semiconductor layer 412 may include silicon, and buried-oxide layer 412 may include silicon dioxide.

In an exemplary embodiment, the fundamental or the carrier wavelength of optical signal 308 is between 1.1-1.7 µm. For example, optical signal 308 (FIG. 3) may have a fundamental or a carrier wavelength of 1.3 or 1.55 µm. Moreover, semiconductor layer 414 may have a thickness that is less than 1 µm (such as 0.2-0.5 µm). For example, semiconductor layer 414 may have a thickness of 0.3 µm. Furthermore, buried-oxide layer 412 may have a thickness between 0.3 and 3 µm (such as 0.8 µm).

Referring back to FIG. 3, hybrid external cavity laser 300 may include a phase-tuning mechanism 332. As shown in FIG. 3, phase tuning mechanism 332 (such as a heater or by using electrical carrier injection) may be in semiconductor optical amplifier 310. Alternatively or additionally, phase-tuning mechanism 332 may be included in photonic chip 316 because phase tuning can be done thermally (e.g. by heating optical waveguide 318 using a heater or a resistor) without causing additional free-carrier absorption loss (which often results when electrical carrier injection is used to tune phase). However, a large effective phase-tuning range (several multiples of 2π) may be required, so one or more additional mechanisms for reducing the phase-tuning range may be used, as described below.

In some embodiments, ring resonator 320 is a very narrowband ring-resonator filter with resonance having a full-width half max (FMHW) that is less than the optical-mode spacing associated with the (hybrid) optical cavity 324. This may ensure that only a few cavity modes (or, preferably, only one cavity mode) may exist within the passband of the ring-resonator filter. For example, ring resonator 320 may have a radius of 5 µm, and an FSR of about 20 nm. Consequently, a ring-resonator filter with a high quality factor may be used as the tuning mirror. Alternatively or additionally, other tunable mirror structures may be used. Note that a narrowband ring-resonator filter may ideally isolate the target optical mode and, thus, may make it easier to sense the optimum location of the optical mode with respect to the ring-resonator filter (e.g., by monitoring the output power and minimizing this output power by finely adjusting resonance wavelength 322 of the ring-resonator filter in order to minimize the amount of power bypassing the ring-resonator filter into the ring-resonator bus optical waveguides). Moreover, because at a given time only one cavity mode may be preferentially lasing, hybrid external cavity laser 300 may monitor the output power even if there are a few optical modes accepted by the ring-resonator filter, and may optimize a given lasing optical mode with respect to the ring-resonator filter. This may allow this optical mode to be locked even as the injected current into hybrid external cavity laser 300 (and, thus, the output power) changes. In addition, by monitoring the amount of power bypassing the ring-resonator filter into the bus optical waveguides as the temperature changes and/or the lasing wavelength begins to drift (e.g., by approximately 0.1 nm/C), hybrid external cavity laser 300 may lock onto the lasing optical mode by optimizing this cavity mode versus resonance wavelength 322 of the ring-resonator filter. While these capabilities may allow hybrid external cavity laser 300 to prevent optical mode-hopping by locking onto a given cavity mode, the lasing wavelength may move because the given lasing cavity mode may (red-)shift versus current (because of internal heating) and as a function of ambient temperature Moreover, hybrid external cavity laser 300 may include at least an optional interferometer 334 (and, more generally, a wavelength sensor), electrically coupled to control logic 330, which may determine the carrier wavelength. For example, optional interferometer 334 may be optically coupled to one of the optical waveguides by an optional optical tap 346 or optional interferometer 334 may replace one of photo-detectors 328. Alternatively or additionally, hybrid external cavity laser 300 may include an interface (not shown) that receives wavelength information from an optional external wavelength sensor (not shown). Using the measured carrier wavelength and/or the wavelength information, control logic 330 may optionally modify the phase in optical cavity 324 (via phase-tuning mechanism 332) and/or resonance wavelength 322 in ring resonator 320 (via thermal-tuning mechanism 326) to adjust the carrier wavelength.

Furthermore, hybrid external cavity laser 300 may include an optional temperature-compensation element 336, optically coupled to optical waveguide 318 (and/or to the optical waveguide in semiconductor optical amplifier 310), which compensates for a temperature dependence of indexes of refraction of optical waveguide 318. For example, optional temperature-compensation element 336 may include a titanium-dioxide optical waveguide to compensate for first-order changes in the cavity-mode spacing as a function of temperature and, thus, effectively annul the phase change in optical cavity 324, which may reduce the phase-tuning range needed for tuning, optimization and/or wavelength drift. Note that reducing the phase-tuning range of drift versus temperature may be important for the overall link and system (especially, for multi-wavelength transmission on a single optical waveguide) in order to ensure that the carrier wavelength remains within a fixed window.

In particular, as discussed in "Temperature-Insensitive Optical Component," by Stevan Djordjevic, Xuezhe Zheng, Jin Yao, John E. Cunningham, Kannan Raj and Ashok V. Krishnamoorthy, U.S. patent application Ser. No. 14/567, 239, filed on Dec. 11, 2014, the contents of which are hereby incorporated herein by reference, global temperature stability of optical cavity 324 may be achieved by canceling out the red-shift (i.e., to larger wavelengths) of an optical waveguide in semiconductor optical amplifier 310 and optical waveguide 318 in photonic chip 316 by an equivalent blue-shift (i.e., to shorter wavelengths) of an amorphous titanium-dioxide ($TiO_2$) core optical waveguide (which may be integrated on photonic chip 316). In addition, a temperature-insensitive reflector may be achieved by cancelling the thermo-optic coefficient of (silicon-core) optical waveguide 318 with that of an amorphous titanium-dioxide upper-cladding (or overcladding) material having a thermo-optic coefficient (TOC) of $-2.15 \cdot 10^{-4}$ $K^{-1}$. More generally, the upper-cladding material may have a large negative thermo-optic coefficient, a medium index of refraction (e.g., an index of refraction equal to 2.420 in the mid-infrared), and/or may be CMOS-compatible. (However, photonic chip 316 and/or hybrid external cavity laser 300 may avoid the use of polymer materials, such as poly-urethane acrylates, having a negative TOC, which often suffer from relaxation, photo-aging, moisture absorption and other adverse properties that usually make them unacceptable in CMOS processing.) Therefore, using this passive approach, hybrid external cavity laser 300 may have significantly reduced temperature dependence (which is sometimes referred to as 'athermal' operation) even in the absence of cooling (and, more generally, temperature control).

Additionally, hybrid external cavity laser 300 may include at least an optional temperature sensor (T.S.) 338, electrically coupled to the control logic 330, which determines a parameter associated with a temperature, and control logic 330 may modify a phase in optical cavity 324 (via phase-tuning mechanism 332) and/or resonance wavelength 322 of ring resonator 320 (via thermal-tuning mechanism 326) to adjust the carrier wavelength based on the determined parameter. For example, the phase may be modified in semiconductor optical amplifier 310 and/or photonic chip 316. Note that the parameter may be associated with at least a temperature of semiconductor optical amplifier 310 (i.e., optional temperature sensor 338 may be in or proximate to semiconductor optical amplifier 310) and/or a temperature of photonic chip 316 (i.e., optional temperature sensor 338 may be in or proximate to photonic chip 316), either or both of which may be related to a case temperature of a package for hybrid external cavity laser 300. Thus, optional temperature sensor 338 may directly measure the temperature (e.g., using a resistor, a diode, a band-gap reference, etc.) or indirectly measure the parameter associated with the temperature (such as based on a physical property or characteristic that is a function of the temperature). Note that the measured parameter may allow control logic 330 to determine if there are differential changes in temperature that may not be fully compensated by optional temperature-compensation element 336, and to adjust the phase (via phase-tuning mechanism 332) and/or resonance wavelength 322 (via thermal-tuning mechanism 326).

In some embodiments, control logic 330 modifies the phase based on a predefined table of temperatures (such as a look-up table) and associated carrier wavelengths. Consequently, control logic 330 may adjust the phase based on the parameter (such as the temperature) to prevent or to reduce mode-hopping. Note that control logic 330 may also use calculated changes in the optical-mode spacing because of changes in the temperature to determine appropriate changes to phase-tuning mechanism 332 in order to stabilize the optical-cavity lasing mode. This capability may allow hybrid external cavity laser 300 to lock to a given wavelength and to control the shift of this cavity mode.

Additionally, hybrid external cavity laser 300 may include a directional coupler 340 optically coupled to the optical waveguide 318, where an output optical signal 342 is output from hybrid external cavity laser 300 at an edge of direction coupler 340. Note that output optical signal 342 may be extracted or output from hybrid external cavity laser 300 in a variety of ways. For example, output optical signal 342 may be output into an optical waveguide. Alternatively, a reflective coating and/or reflector may only partially reflect output optical signal 342. In particular, a low-reflectivity (20-30%) coating may be used so that output optical signal 342 is output at edge 344 of photonic chip 316. This approach may allow output optical signal 342 to be output directly into an optical fiber.

Therefore, hybrid external cavity laser 300 may include or may use a set of techniques to monitor, control, and stabilize the lasing wavelength and to prevent optical mode-hopping. The aforementioned structural changes to hybrid external cavity laser 300 may reduce the amount of wavelength drift experienced by hybrid external cavity laser 300 during operation as the injected current (and, hence, output power), as well as the ambient temperature, changes.

For clarity, the discussion that follows is focused on the structure and operation of a feedback loop in a silicon-assisted hybrid external cavity laser that is designed to be optical mode-hop free. This feedback loop assumes that the lasing cavity mode may drift with applied input current and temperature, and controls resonance wavelength 322 of the ring-resonator filter in order to lock it on to a given lasing cavity mode. Note that the addition of the phase-tuning mechanism 332 and optional temperature-compensation element 336 may help hybrid external cavity laser 300 lock to the specific lasing cavity mode by reducing the lasing-wavelength excursion versus temperature. In addition, note that the feedback technique used in the feedback loop may be based on real-time monitoring of the output power.

In an exemplary embodiment, the resonance effect in micro-ring resonators is used to implement a wavelength-selective filter with high-extinction ratio and narrow bandwidth. These ring resonators also provide an efficient wavelength-tuning mechanism through a thermo-optical effect and/or a plasma-carrier effect. However, because of the narrow working optical bandwidth of ring resonators, it is often necessary to lock-in the operating wavelength and minimize wavelength drift, which is often caused by external environmental changes (such as temperature) and the effective index of refraction.

For an application such as an optical modulator, resonance wavelength 322 may be aligned to the operating laser wavelength, and resonance wavelength 322 may be controlled by monitoring resonance wavelength 322 and active feedback to ring resonator 320 by applying power to an electrical or a thermal tuner (such as thermal-tuning mechanism 326) that is integrated with ring resonator 320. Moreover, in order to achieve stable laser operation, resonance wavelength 322 may not need to be locked to a certain wavelength, such as a target carrier wavelength. Instead, resonance wavelength 322 may be locked to a specific cavity mode and may be synchronized with drift of this cavity mode even as the laser temperature, current and/or other external factors change. Consequently, it may still be necessary to implement a monitoring mechanism (such as optional interferometer 334) that can warn against laser drift due to optical mode-hopping and that can keep the laser drift within an optical mode-hop-free optimum operation regime.

We now describe how this monitoring mechanism works and present examples of its application.

When a micro-ring is used as a wavelength-selective filter in hybrid external cavity laser 300, it may be necessary to use feedback to keep the laser wavelength stable regardless of external influences, such as: temperature drift, driving power change, etc. As shown in FIG. 3, semiconductor optical amplifier 310 may include an optical gain medium and/or phase-tuning mechanism 332 that provides optical gain for laser amplification, and may include high (near 100%) reflective coating 314 on edge 312-1 which acts as a mirror for the cavity feedback. In photonic chip 316, the micro-ring (i.e., ring resonator 320) may be combined with a Y-junction to form a loop-mirror-type reflector in which resonance wavelength 322 is reflected back to optical cavity 324. The main laser output may pass through the two arms of directional coupler 340, in which the coupling ratio determines the laser-output coupling ratio.

Note that there may be two additional output ports that are optically coupled to the through ports from the ring-reflector bus optical waveguides. These ports may be used as the monitoring port for the feedback system. When the injected electrical power (current) exceeds the laser threshold, hybrid external cavity laser 300 may begin to lase and the lasing wavelength may be determined by the overlap of the gain spectrum (which is typically large) with the resonance of the ring-resonator filter (which typically has a large free-spectral range, and which ideally is larger than the gain spectrum peak) and the cavity mode (which typically has a small free-spectral range). Consequently, the ring-filter band and optical-gain bandwidth may jointly determine the specific cavity mode that lases. Because the optical gain is typically large, the overlap of the resonance of the ring-resonator filter with the cavity modes may determine the lasing mode and the specific cavity mode that experiences the most reflection through the ring-resonator-filter mirror (and, thus, the greatest optical gain) is the one that lases.

Figure 5:
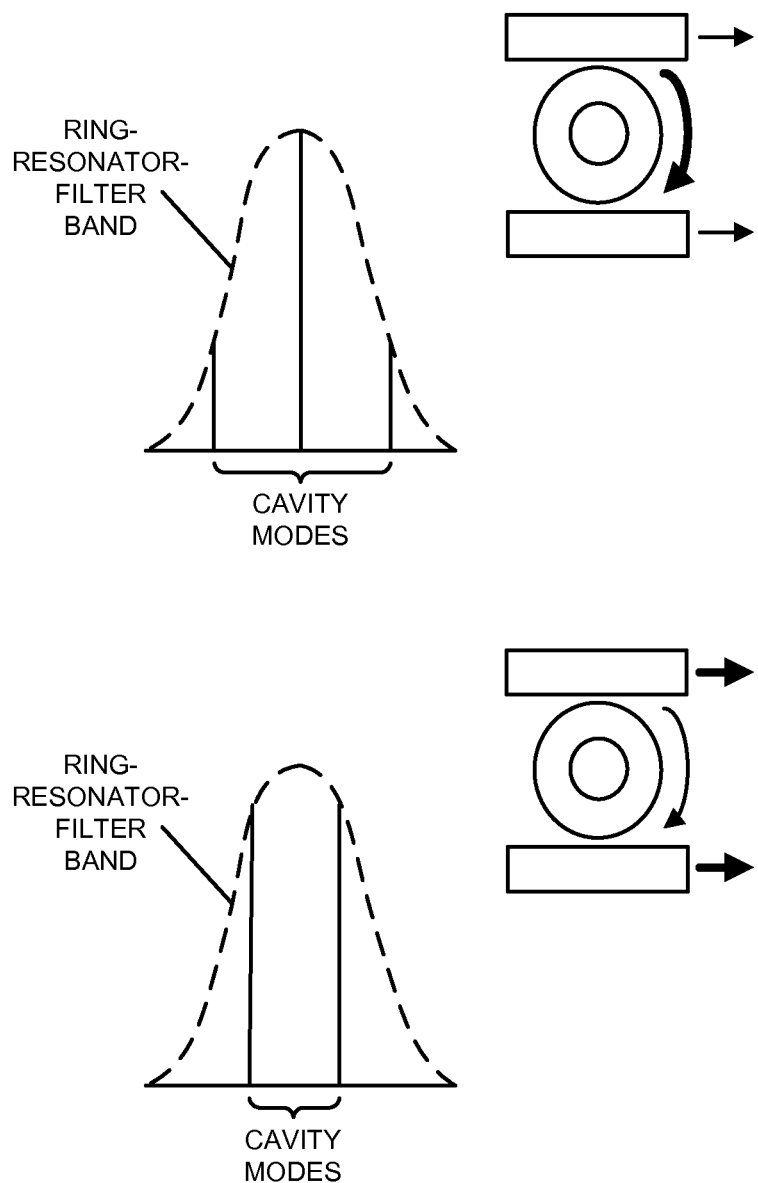
FIG. 5 is a drawing illustrating cavity modes in the hybrid external cavity laser of FIG. 3 in accordance with an embodiment of the present disclosure.

As shown in the upper portion of FIG. 5, which presents a drawing illustrating cavity modes in hybrid external cavity laser 300 in FIG. 3, when the cavity mode is aligned with the resonance peak of ring resonator 320 in FIG. 3 (i.e., resonance wavelength 322), the hybrid external cavity laser operates in its optimum condition so that most of light stays inside optical cavity 324 and negligible light escapes through the monitoring port. Note that ring resonator 320 may be tunable and can be controlled. Because the cavity modes may be determined by the effective index of refraction in optical cavity 324 and the total optical-cavity length, these cavity modes may be the most vulnerable to drift resulting from internal influences (such as current injection and temperature changes), as well as external influences (such as the temperature drift). The drift in the cavity modes may result in potential misalignment between the specific lasing cavity mode and the resonance peak of ring resonator 320 (FIG. 3). In this case, as shown in the lower portion of FIG. 5, the optical coupling to ring resonator 320 (FIG. 3) may decrease and more light may escape through the monitoring port. Therefore, when the optical power at the monitoring port increases, it may indicate that the cavity mode is deviating from resonance wavelength 322 and may be approaching a mode-hopping condition.

When at least one of photo-detectors 328 (FIG. 3) detects the increase in the output power at the monitoring port, the feedback-control loop (via control logic 330 in FIG. 3) may control the resonance wavelength 322 (FIG. 3) and/or the phase of optical cavity 324 (at semiconductor optical amplifier 310 and/or photonic chip 316 in FIG. 3) by applying electrical control power (e.g., by heating or electrically tuning ring resonator 320 in FIG. 3) until the monitored output power is minimized so that the hybrid external cavity laser is again operating in the optimum condition.

As noted previously, the feedback-control system may be an electronic control unit (such as control logic 330 in FIG. 3) that is capable of monitoring photocurrent from integrated photo-detector(s) 328 (FIG. 3) on the monitoring port and driving tuning power to thermal-tuning mechanism 326 and/or phase-tuning mechanism 332 on either or both of semiconductor optical amplifier 310 and/or photonic chip 316 in FIG. 3 based on a control technique (such as a bang-bang controller).

Note that control logic 330 may be integrated with the hybrid external cavity laser either monolithically on photonic chip 316 or heterogeneously using flip-chip bonding to a VLSI circuit. Using the feedback-control technique, the laser operation can be actively stabilized so that the lasing cavity mode is locked to resonance wavelength 322, which allows the lasing cavity mode and resonance wavelength 322 to be continuously synchronized and to drift together regardless of external influences. (However, as noted previously, measurements of the wavelength information, such as via optional interferometer 334 in FIG. 3, may be used to adjust the carrier wavelength to correct for the drift.) In addition, the feedback system may not affect the performance and efficiency of the hybrid external cavity laser because the monitoring port is not associated with the main-laser output and there may not be a need to add another optical port to monitor the laser cavity. Because the feedback system monitors the optical power intensity in real-time (or with a sufficient sampling rate), the control-system design and monitoring configuration may be simplified. As noted previously, the phase of the hybrid external cavity laser may also be controlled using optional temperature-compensation element 336 in FIG. 3, which may reduce the amount of the co-drift.

Figure 6:
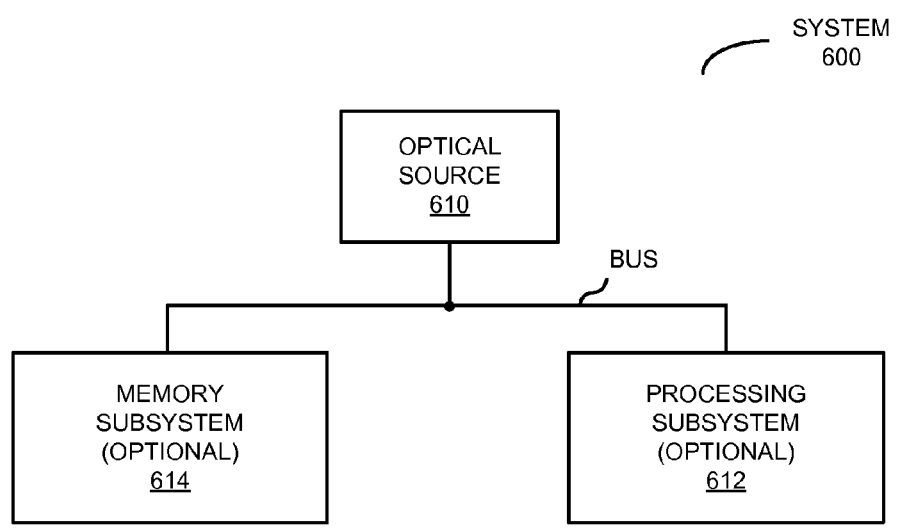
FIG. 6 is a block diagram illustrating a system that includes an optical source in accordance with an embodiment of the present disclosure.

One or more of the preceding embodiments of the optical source may be included in a system and/or an electronic device. FIG. 6 presents a block diagram illustrating a system 600 that includes an optical source 610 (such as hybrid external cavity laser 300 in FIG. 3), processing subsystem 612 and memory subsystem 614.

In general, functions of hybrid external cavity laser 300 (FIG. 3), optical source 610, and system 600 may be implemented in hardware and/or in software. Thus, system 600 may include one or more program modules or sets of instructions stored in a memory subsystem 614 (such as DRAM or another type of volatile or non-volatile computer-readable memory), which may be executed by processing subsystem 612. Note that the one or more computer programs may constitute a computer-program mechanism. Furthermore, instructions in the various modules in memory subsystem 614 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses. These connections may include electrical, optical, or electro-optical communication of signals and/or data. Furthermore, in the preceding embodiments, some components are shown directly connected to one another, while others are shown connected via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include one of a variety of devices, including: a VLSI circuit, a switch, a hub, a bridge, a router, a communication device or system (such as a WDM communication system), a storage area network, a data center, a network (such as a local area network), a computer system (such as a multiple-core processor computer system), a desktop or personal computer, a server (such as a multi-socket, multi-rack server), a work station, a mainframe computer, a blade, an enterprise computer, a supercomputer, a network-attached-storage (NAS) system, a storage-area-network (SAN) system, a laptop computer, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

The preceding embodiments may include fewer components or additional components. For example, semiconductor layer 414 (FIG. 4) may include poly-silicon or amorphous silicon. Furthermore, a wide variety of fabrication techniques may be used to fabricate the optical source in the preceding embodiments, as is known to one of skill in the art. In addition, a wide variety of optical components may be used in or in conjunction with the optical source.

Although these embodiments are illustrated as having a number of discrete items, the embodiments of the optical source and the system are intended to be functional descriptions of the various features that may be present rather than structural schematics of the embodiments described herein. Consequently, in these embodiments two or more components may be combined into a single component, and/or a position of one or more components may be changed.

Figure 7:
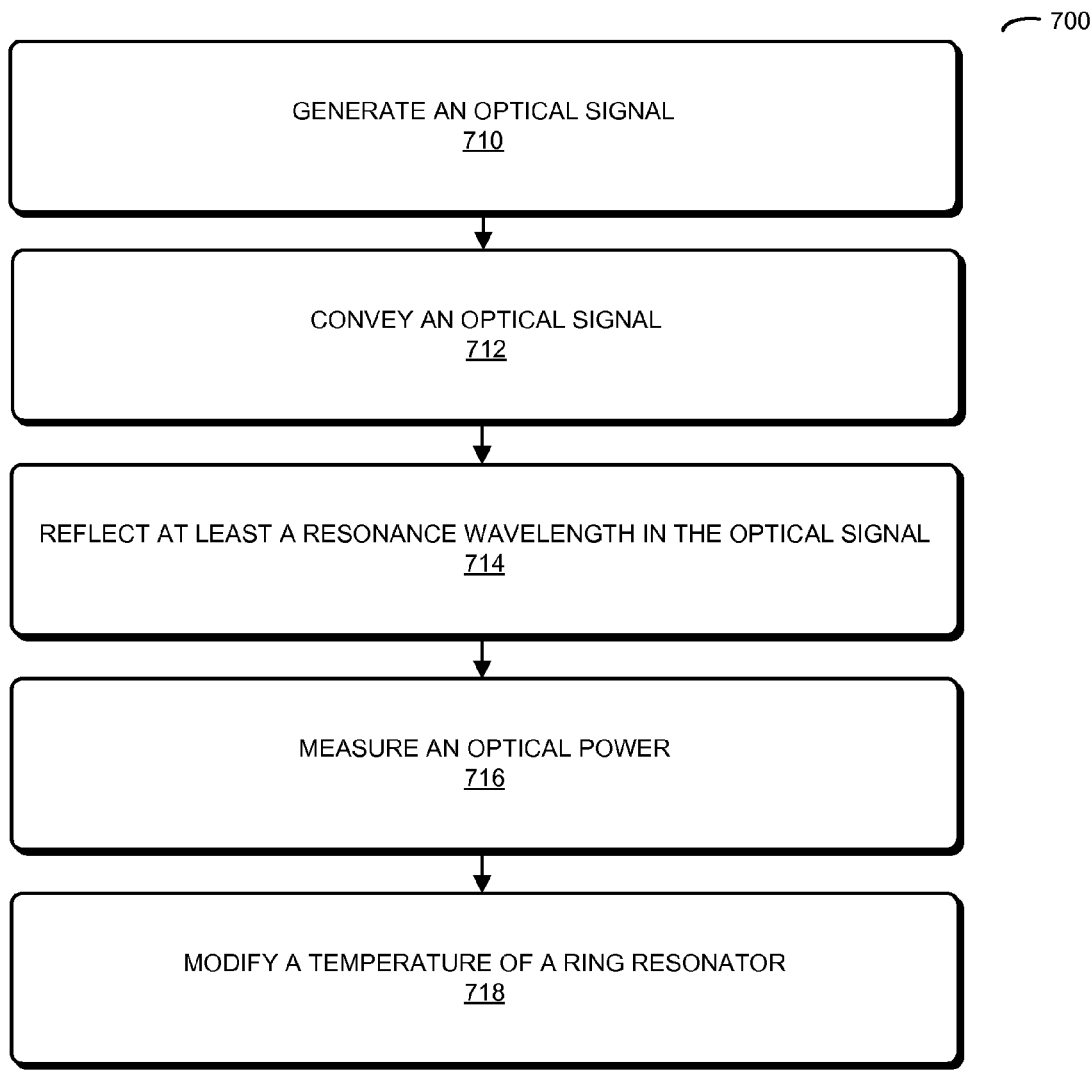
FIG. 7 is a flow chart illustrating a method for locking a cavity mode for an external cavity laser in accordance with an embodiment of the present disclosure.

We now describe embodiments of the method. FIG. 7 presents a flow chart illustrating a method 700 for locking a cavity mode for an external cavity laser, such as hybrid external cavity laser 300 (FIG. 3). During operation of the external cavity laser, an optical signal is generated (operation 710) in a semiconductor optical amplifier defined in a semiconductor other than silicon, where the semiconductor optical amplifier includes a reflective coating on a first edge, and the semiconductor optical amplifier provides the optical signal at a second edge. Then, the external cavity laser conveys the optical signal (operation 712) in an optical waveguide on a photonic chip. Moreover, the external cavity laser reflects at least a resonance wavelength in the optical signal (operation 714) using a ring resonator having the resonance wavelength, where the reflective coating and the ring resonator define an optical cavity. Next, the external cavity layer measures an optical power (operation 716)

output by the ring resonator using a photo-detector. Furthermore, the external cavity layer modifies a temperature of the ring resonator (operation 718) using a thermal-tuning mechanism, thermally coupled to the ring resonator, to adjust the resonance wavelength based on the measured optical power to lock the cavity mode of the optical cavity.

In some embodiments of method 700, there may be additional or fewer operations. Moreover, the order of the operations may be changed, and/or two or more operations may be combined into a single operation.

While the preceding embodiments illustrate the use of the optical source in conjunction with an optical link, the optical source may be used in applications other than communications, such as: manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical source, comprising:
   a semiconductor optical amplifier defined in a semiconductor other than silicon and having a first edge and a second edge, wherein the semiconductor optical amplifier includes a reflective coating on the first edge, and wherein the semiconductor optical amplifier is configured to provide an optical signal at the second edge; and
   a photonic chip optically coupled to the semiconductor optical amplifier, wherein the photonic chip includes:
   an optical waveguide configured to convey the optical signal;
   a ring resonator, optically coupled to the optical waveguide and having a resonance wavelength, configured to reflect at least the resonance wavelength in the optical signal, wherein the reflective coating and the ring resonator define an optical cavity;
   a thermal-tuning mechanism, thermally coupled to the ring resonator, configured to adjust the resonance wavelength;
   a photo-detector, optically coupled to an output of the ring resonator, configured to measure optical power output by the ring resonator; and
   control logic, electrically coupled to the thermal-tuning mechanism and the photo-detector, configured to adjust the temperature of the ring resonator based on the measured optical power to lock a cavity mode of the optical cavity to a carrier wavelength
   wherein the optical source further includes a temperature-compensation element, optically coupled to the optical waveguide, configured to compensate for a temperature dependence of indexes of refraction of the optical waveguide.

2. The optical source of claim 1, wherein the semiconductor optical amplifier is edge-coupled to the photonic chip.

3. The optical source of claim 1, wherein the semiconductor optical amplifier is surface-normal coupled to the photonic chip.

4. The optical source of claim 1, wherein the photonic chip includes:
   a substrate;
   a buried-oxide layer disposed on the substrate; and
   a semiconductor layer disposed on the buried-oxide layer, wherein the optical waveguide and the ring resonator are defined in the semiconductor layer.

5. The optical source of claim 4, wherein the substrate, the buried-oxide layer and the semiconductor layer constitute a silicon-on-insulator technology.

6. The optical source of claim 1, wherein the optical source further includes a directional coupler optically coupled to the optical waveguide; and
   wherein an output optical signal is output from the optical source at an edge of the direction coupler.

7. The optical source of claim 1, wherein the control logic is configured to adjust the temperature of the ring resonator to minimize the measured optical power.

8. The optical source of claim 1, wherein the optical source further includes at least a temperature sensor, electrically coupled to the control logic, configured to determine a parameter associated with a temperature; and
   wherein the control logic is configured to modify a phase in the optical cavity to adjust the carrier wavelength based on the determined parameter.

9. The optical source of claim 8, wherein the parameter is associated with at least one of: a temperature of the semiconductor optical amplifier; and a temperature of the photonic chip.

10. The optical source of claim 8, wherein the phase is modified in one of: the semiconductor optical amplifier; and the photonic chip.

11. The optical source of claim 8, wherein the control logic modifies the phase based on a predefined table of temperatures and associated carrier wavelengths.

12. The optical source of claim 1, wherein the optical source further includes at least an interferometer, electrically coupled to the control logic, configured to determine the carrier wavelength; and
   wherein the control logic is configured to modify a phase in the optical cavity to adjust the carrier wavelength based on the determined carrier wavelength.

13. The optical source of claim 1, wherein the temperature-compensation element includes a titanium-dioxide optical waveguide.

14. A system, comprising:
   a processor;
   memory, coupled to the processor, configured to store a program module; and
   an optical source, wherein the optical source includes:
   a semiconductor optical amplifier defined in a semiconductor other than silicon and having a first edge and a second edge, wherein the semiconductor optical amplifier includes a reflective coating on the first edge, and wherein the semiconductor optical amplifier is configured to provide an optical signal at the second edge; and a photonic chip optically coupled to the semiconductor optical amplifier, wherein the photonic chip includes:

an optical waveguide configured to convey the optical signal;

a ring resonator, optically coupled to the optical waveguide and having a resonance wavelength, configured to reflect at least the resonance wavelength in the optical signal, wherein the reflective coating and the ring resonator define an optical cavity;

a thermal-tuning mechanism, thermally coupled to the ring resonator, configured to adjust the resonance wavelength;

a photo-detector, optically coupled to an output of the ring resonator, configured to measure optical power output by the ring resonator; and control logic, electrically coupled to the thermal-tuning mechanism and the photo-detector, configured to adjust the temperature of the ring resonator based on the measured optical power to lock a cavity mode of the optical cavity to a carrier wavelength wherein the optical source further includes a temperature-compensation element, optically coupled to the optical waveguide, configured to compensate for a temperature dependence of indexes of refraction of the optical waveguide.

15. The system of claim 14, wherein the optical source further includes a directional coupler optically coupled to the optical waveguide; and wherein an output optical signal is output from the optical source at an edge of the direction coupler.

16. The system of claim 14, wherein the control logic is configured to adjust the temperature of the ring resonator to minimize the measured optical power.

17. The system of claim 14, wherein the optical source further includes at least a temperature sensor, electrically coupled to the control logic, configured to determine a parameter associated with a temperature of at least one of: the semiconductor optical amplifier; and the photonic source; and wherein the control logic is configured to modify a phase in the optical cavity to adjust the carrier wavelength based on the determined parameter.

18. The system of claim 14, wherein the optical source further includes at least an interferometer, electrically coupled to the control logic, configured to determine the carrier wavelength; and wherein the control logic is configured to modify a phase in the optical cavity to adjust the carrier wavelength based on the determined carrier wavelength.

19. A method for locking a cavity mode for an external cavity laser, the method comprising:

generating an optical signal in a semiconductor optical amplifier defined in a semiconductor other than silicon, wherein the semiconductor optical amplifier includes a reflective coating on a first edge, and wherein the semiconductor optical amplifier provides the optical signal at a second edge;

conveying the optical signal in an optical waveguide on a photonic chip;

reflecting at least a resonance wavelength in the optical signal using a ring resonator having the resonance wavelength, wherein the reflective coating and the ring resonator define an optical cavity;

measuring an optical power output by the ring resonator using a photo-detector; and modifying a temperature of the ring resonator using a thermal-tuning mechanism, thermally coupled to the ring resonator, to adjust the resonance wavelength based on the measured optical power to lock the cavity mode of the optical cavity using a temperature-compensation element, optically coupled to the optical waveguide, to compensate for a temperature dependence of indexes of refraction of the optical waveguide.

* * * * *

UNITED STATES PATENT AND TRADEMARK OFFICE
CERTIFICATE OF CORRECTION

PATENT NO. : 9,837,781 B2  
APPLICATION NO. : 14/714078  
DATED : December 5, 2017  
INVENTOR(S) : Krishnamoorthy et al.

Page 1 of 1

It is certified that error appears in the above-identified patent and that said Letters Patent is hereby corrected as shown below:

In Column 7, Line 29, after "temperature" insert -- . --.

Signed and Sealed this  
Third Day of July, 2018

Andrei Iancu  
*Director of the United States Patent and Trademark Office*